United States Patent
Lin (10) Patent No.: US 12,321,071 B2
(45) Date of Patent: *Jun. 3, 2025

(54) ELECTRONIC DEVICE

(71) Applicant: InnoLux Corporation, Miao-Li County (TW)

(72) Inventor: Chun-Hsien Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/645,699

(22) Filed: Apr. 25, 2024

(65) Prior Publication Data

US 2024/0295783 A1 Sep. 5, 2024

Related U.S. Application Data

(63) Continuation of application No. 18/171,510, filed on Feb. 20, 2023, now Pat. No. 11,994,779, which is a continuation of application No. 17/471,514, filed on Sep. 10, 2021, now Pat. No. 11,609,464.

(30) Foreign Application Priority Data

Oct. 23, 2020 (CN) .......................... 202011144821.4

(51) Int. Cl.
*G02F 1/1362* (2006.01)
*H10K 59/131* (2023.01)

(52) U.S. Cl.
CPC .. *G02F 1/136263* (2021.01); *G02F 1/136227* (2013.01); *H10K 59/131* (2023.02); *G02F 2201/506* (2013.01)

(58) Field of Classification Search
CPC ......... G02F 1/136263; G02F 1/136227; G02F 2201/506; G02F 1/136259; G02F 1/136272; G02F 1/1309; G02F 1/136204; H10K 59/131; H10K 59/122; H10K 59/124; H10K 71/861; H01L 27/124; H01L 27/15
See application file for complete search history.

(56) References Cited

U.S. PATENT DOCUMENTS

2011/0180908 A1* 7/2011 Naganuma ........ H01L 23/49822
438/479

* cited by examiner

*Primary Examiner* — Donald L Raleigh
(74) *Attorney, Agent, or Firm* — McClure, Qualey & Rodack, LLP (57) ABSTRACT

An electronic device includes a conductive structure, a semiconductor, a first insulation layer and a second insulation layer. The semiconductor is electrically connected to the conductive structure. The first insulation layer is disposed between the conductive structure and the second insulation layer. The first insulation layer includes a first hole, and the first hole overlaps a part of the conductive structure. The second insulation layer includes a second hole, and the first hole and the second hole at least partially overlap. Along a direction, a width of the second hole is less than a width of the first hole.

10 Claims, 9 Drawing Sheets

ELECTRONIC DEVICE

CROSS REFERENCE TO RELATED APPLICATIONS

This application is a Continuation of application Ser. No. 18/171,510, filed on Feb. 20, 2023, now U.S. Pat. No. 11,994,779, which is a Continuation of U.S. patent application Ser. No. 17/471,514, filed Sep. 10, 2021, now U.S. Pat. No. 11,609,464, which claims priority of China Patent Application No. 202011144821.4, filed on Oct. 23, 2020, the entirety of which is incorporated by reference herein.

CROSS REFERENCE TO RELATED APPLICATIONS

Field of the Disclosure

The disclosure relates to an electronic device.

DESCRIPTION OF THE RELATED ART

An errant particle or an electrostatic discharge (ESD) may cause a defect to occur in the signal line (such as a scan line, a data line, a power line, or a signal driving line) of a conventional electronic device. The signal line will therefore need to be repaired in order to eliminate the defect. However, the current manner of repairing signal lines is time-consuming, and the repair design is very complex. Therefore, a new repair design is needed to solve this problem.

BRIEF SUMMARY OF THE DISCLOSURE

An embodiment of the disclosure provides an electronic device, which includes a conductive structure, a semiconductor, a first insulation layer and a second insulation layer. The semiconductor is electrically connected to the conductive structure. The first insulation layer is disposed between the conductive structure and the second insulation layer. The first insulation layer includes a first hole, and the first hole overlaps a part of the conductive structure. The second insulation layer includes a second hole, and the first hole and the second hole at least partially overlap. Along a direction, a width of the second hole is less than a width of the first hole.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

In the following specification and claims, the "including" or "comprising" mentioned in the entire specification and claims is an open term, so it should be interpreted as "including but not limited to". It will be understood that when an element or layer is referred to as being "on", "connected to" or "coupled to" another element or layer, the element or layer can be directly on, connected or coupled to another element or layer or intervening elements or layers may be present. In contrast, when an element is referred to as being "directly on," "directly connected to" or "directly coupled to" another element or layer, there are no intervening elements or layers present.

In the disclosure, the length, and width may be measured by using an optical microscope (OM), and the thickness may be measured from a section image in a scanning electron microscope (SEM), but the disclosure is not limited thereto. In addition, there may be a certain error in any two values or directions used for comparison.

In the disclosure, the technical features of the various embodiments may be replaced or combined with each other to complete other embodiments without being mutually exclusive.

Figure 1:
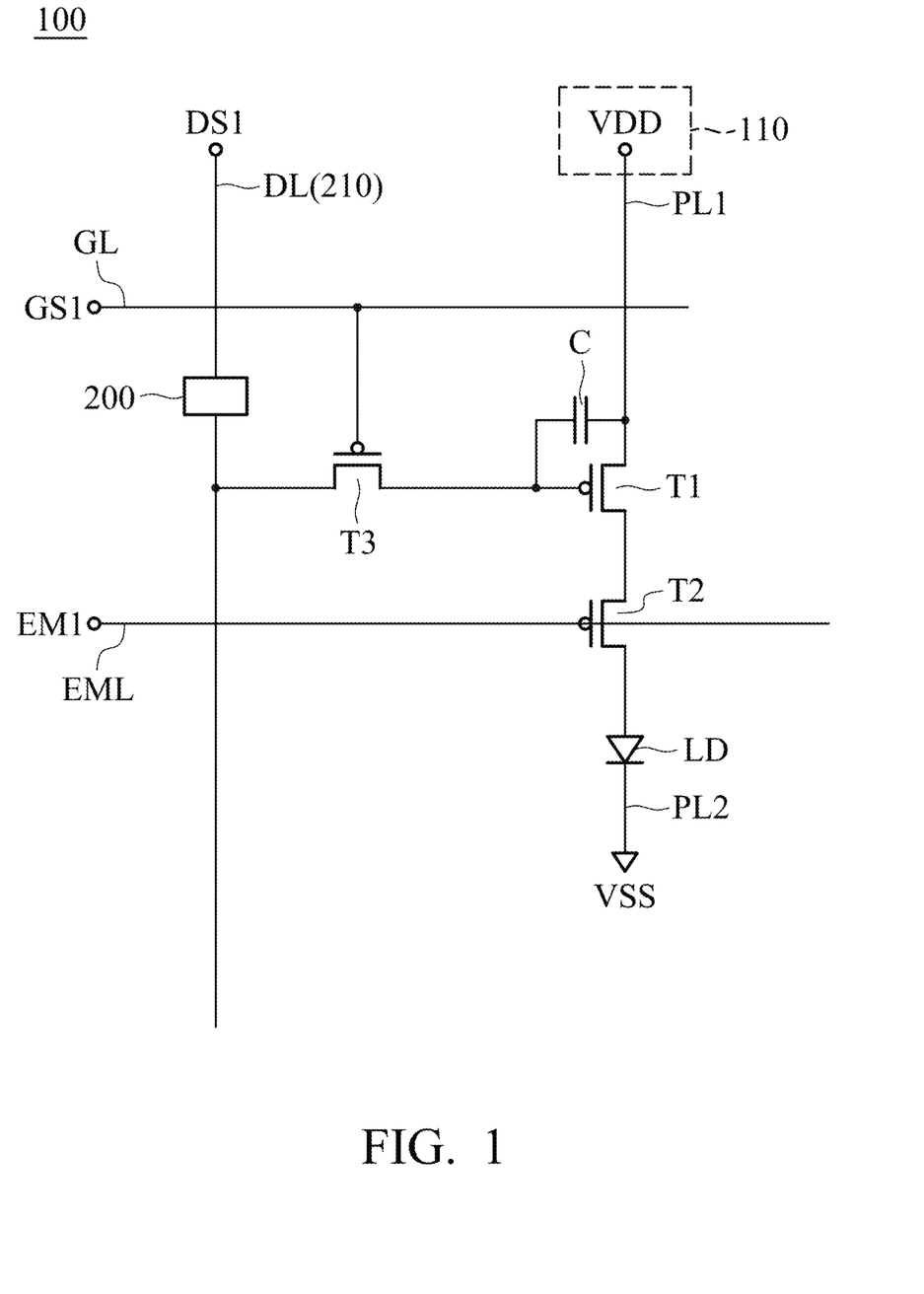
FIG. 1 is a schematic view of an electronic device according to an embodiment of the disclosure.

FIG. 1 is a schematic view of an electronic device according to an embodiment of the disclosure. In an embodiment, the electronic device 100 may include a liquid crystal (LC), an organic light-emitting diode (OLED), a light-emitting diode (LED), a quantum dot (QD), a fluorescence, a phosphor, other suitable materials, or a combination thereof, but the disclosure is not limited thereto. The light-emitting diode may include, for example, a mini light-emitting diode (mini LED), a micro light-emitting diode (micro LED) or a quantum dot light-emitting diode, QLED/QDLED), but the disclosure is not limited thereto.

In some embodiments, the electronic device 100 may be a display device, an antenna device, a sensing device, a touch display device, a curved display device or a free shape display device, and may also be a bendable or flexible splicing electronic device, but the disclosure is not limited thereto. The antenna device may be, for example, a liquid-crystal antenna, but the disclosure is not limited thereto. It should be noted that the electronic device 100 may be any arrangement and combination of the above devices, but the disclosure is not limited thereto. In addition, the appearance of the electronic device 100 may be rectangular, circular, polygonal, a shape with curved edges, or other suitable shapes. The electronic device 100 may include peripheral system, such as a driving system, a control system, a light source system, a shelf system, etc., to support the display device or the antenna device.

Figure 2A:
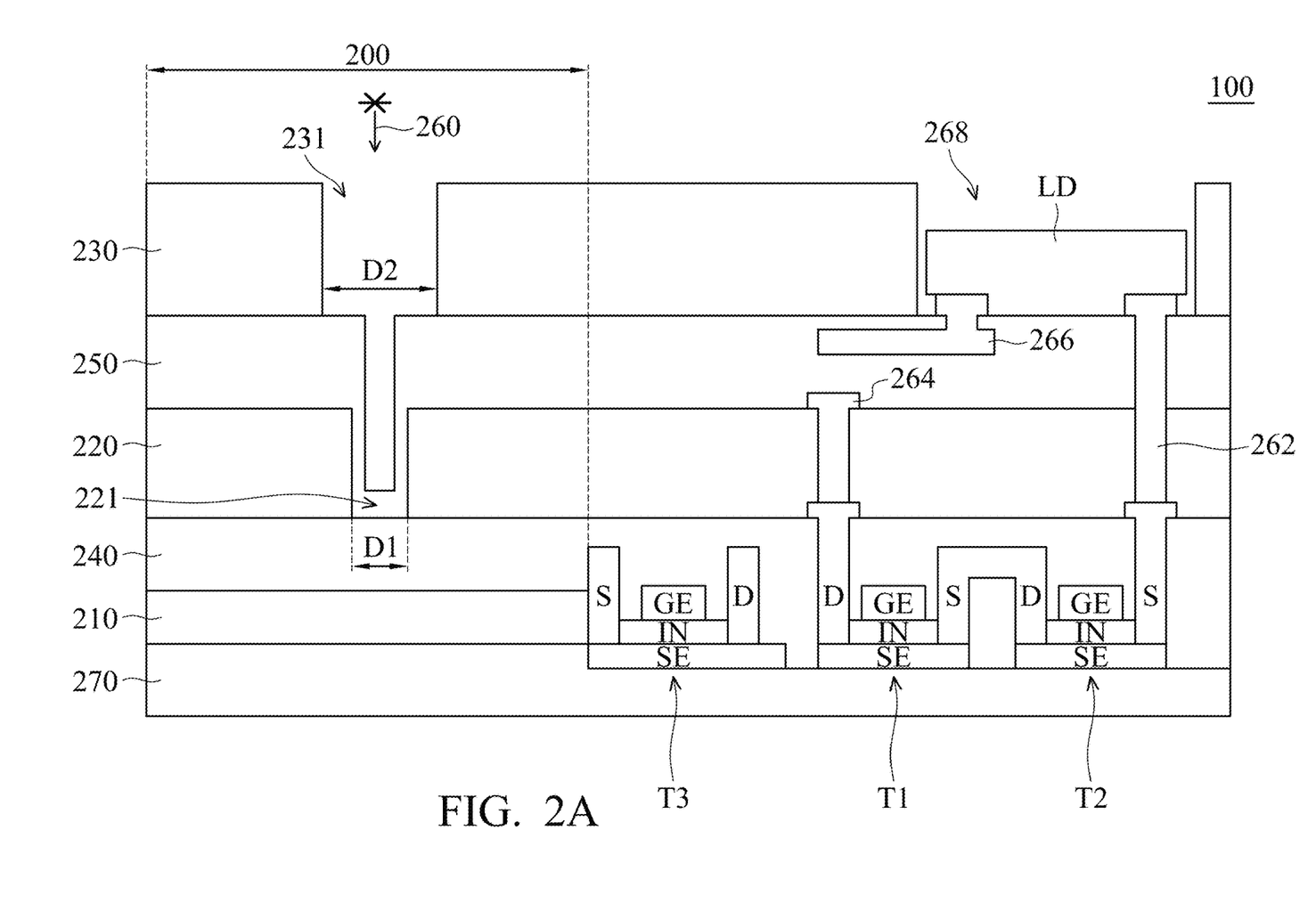
FIG. 2A is a section view of an electronic device according to an embodiment of the disclosure.

In an embodiment, the electronic device 100 may be the display device, but the disclosure is not limited thereto. Please refer to FIG. 1. The electronic device 100 may include a power source unit 110, a switch T1, a switch T2, a switch T3, a capacitor C and a light-emitting unit LD. As shown in FIG. 1, the electronic device 100 further includes a repairing structure 200, and the repairing structure 200 may include a signal line 210. As shown in FIG. 1, the signal line 210 may be a data line DL. FIG. 2A is a section view of an electronic device 100 according to an embodiment of the disclosure, which shows position relationships of the repairing structure 200, the switch T1, the switch T2, the switch T3 and the light-emitting unit LD. In the embodiment of FIG. 1, the signal line 210 takes the data line DL as an example. According to other embodiments, the signal line may be a gate line GL, an emission signal line EML, other signals, or a combination thereof.

Please refer to FIG. 2A, the repairing structure 200 may include a signal line 210, a first insulation layer 220 and a second insulation layer 230. The first insulation layer 220 is disposed on the signal line 210, and the second insulation layer 230 is disposed on the first insulation layer 220. The first insulation layer 220 includes a first hole 221, and the second insulation layer 230 includes a second hole 231. The first hole 221 overlaps a part of the signal line 210, and the first hole 221 and the second hole 231 at least partially overlap.

Please refer to FIG. 1, the switch T1 is coupled to the power source unit 110. In an embodiment, the switch T1 may be a thin film transistor (TFT), but the disclosure is not limited thereto. The power source unit 110 provides a power source VDD, and the power source unit 110 provides the power source VDD to the switch T1 through a first power source line PL1. The switch T2 is coupled to the switch T1. In an embodiment, the switch T2 may be a thin film transistor, but the disclosure is not limited thereto. In addition, a gate of the switch T2 may receive an emission signal EM1 through an emission signal line EML.

The capacitor C is coupled to the switch T1. Furthermore, a first terminal of the capacitor C may be coupled to a gate of the first switch T1, and a second terminal of the capacitor C may be coupled to an electrode (such as a source) of the switch T1.

The switch T3 is coupled to the switch T1. In an embodiment, the switch T3 may be a thin film transistor, but the disclosure is not limited thereto. Furthermore, a gate of the switch T3 may receive a scan signal GS1 through a gate line GL, and an electrode (such as a source) of the switch T3 may receive a data signal DS1 through a data line DL.

The light-emitting unit LD is coupled to the switch T2. Furthermore, a first terminal (such as an anode terminal) of the light-emitting unit LD is coupled to an electrode (such as a drain) of the switch T2, and a second terminal (such as a cathode terminal) of the light-emitting unit LD is coupled to a reference voltage VSS (such as a ground voltage) through a second power source line PL2. In the embodiment, the light-emitting unit LD may be the OLED, the LED, the mini LED, the micro LED, the QLED/QD-LED, or a combination thereof, but the disclosure is not limited thereto.

In the embodiment, the repairing structure 200 may be pre-disposed in a position that the electronic device 100 needs to be repaired, so that when the electronic device 100 occurs a defect, the circuit of the electronic device 100 may be repaired through the repairing structure 200. The repairing structure 200 may include the signal line 210, the first insulation layer 220, the second insulation layer 230, a third insulation layer 240, a fourth insulation layer 250, a fifth insulation layer 270 and a repairing line 280.

The first insulation layer 220 is disposed on the signal line 210. The second insulation layer 230 is disposed on the first insulation layer 220. The first insulation layer 220 includes a first hole 221, and the first hole 221 overlaps a part of the signal line 210. The second insulation layer 230 includes a second hole 231, and the first hole 221 and the second hole 231 at least partially overlap. The fifth insulation layer 270 is disposed between the signal line 210 and the repairing line 280. In the embodiment, the width D2 of the second hole 231 is, for example, greater than the width D1 of the first hole 221. The width D1 may be the width at the bottom of the first hole 221. The width D2 may be the width at the bottom of the second hole 231.

In the embodiment, the first insulation layer 220 may be a planarization layer (PLN), and the second insulation layer 230 may be a pixel defining layer (PDL), but the disclosure is not limited thereto.

In some embodiments, materials of the signal line 210 and the repairing line 280 may be conductive materials, such as metal materials, but the disclosure is not limited thereto. Materials of the first insulation layer 220, the second insulation layer 230, the third insulation layer 240, the fourth insulation layer 250 and the fifth insulation layer 270 are not limited, and may be organic materials, inorganic materials, or a combination thereof. According to some embodiments, the materials of the first insulation layer 220 and the second insulation layer 230 may be organic materials, but the disclosure is not limited thereto. The organic material may be, for example, acrylic resin, epoxy, silicon oxycarbide, other resins, or a combination thereof, but the disclosure is not limited thereto. The materials of the third insulation layer 240, the fourth insulation layer 250 and the fifth insulation layer 270 may be the inorganic materials, such as $SiN_x$, $SiO_x$, or a combination thereof, but the disclosure is not limited thereto.

In some embodiments, the thickness of the second insulation layer 230 is, for example, greater than the thickness of the first insulation layer 220. In some embodiments, the thickness of the second insulation layer 230 may be 4-10 micrometers (um), e.g., it may be 5-6 micrometers. In some embodiments, the thickness of the first insulation layer 220 may be 1-3 micrometers, e.g., it may be 1.7-2.3 micrometers. Furthermore, the thickness of the first insulation layer 220 may be 2 micrometers. In addition, in some embodiments, the thickness of the first insulation layer 220 may be greater than the thickness of the signal line 210. In some embodiments, the thickness of the signal line 210 may be 0.2-1 micrometers, e.g., it may be 0.4-0.8 micrometers, or 0.51-0.69 micrometers. Furthermore, the thickness of the signal line 210 may be 0.6 micrometers. In some embodiments, thickness of the third insulation layer 240 and thickness of the fourth insulation layer 250 may be less than the thickness of the first insulation layer 220. The thickness of the third insulation layer 240 and thickness of the fourth insulation layer 250 may be 0.2-1 micrometer, e.g., it may be 0.425-0.575 micrometers. Furthermore, the thickness of the third insulation layer 240 and thickness of the fourth insulation layer 250 may be 0.5 micrometers.

In the embodiment, the signal line 210 may be the data line DL of the electronic device 100, but the disclosure is not limited thereto. In some embodiments, the signal line 210 may also be the scan line GL, the first power source line PL1, the emission signal line EML or the second power source line, and the similar repairing effect may also be achieved.

As shown in FIG. 2A, in the embodiment, the user may operate a laser light source 260 to generate a laser beam, and the laser beam from the laser light source 260 may pass through the second hole 231 of the second insulation layer 230 and the first hole 221 of the first insulation layer 220 to the signal line 210, so as to perform a laser cutting or a laser welding on the signal line 210. The detailed description is as follows.

Figure 4:
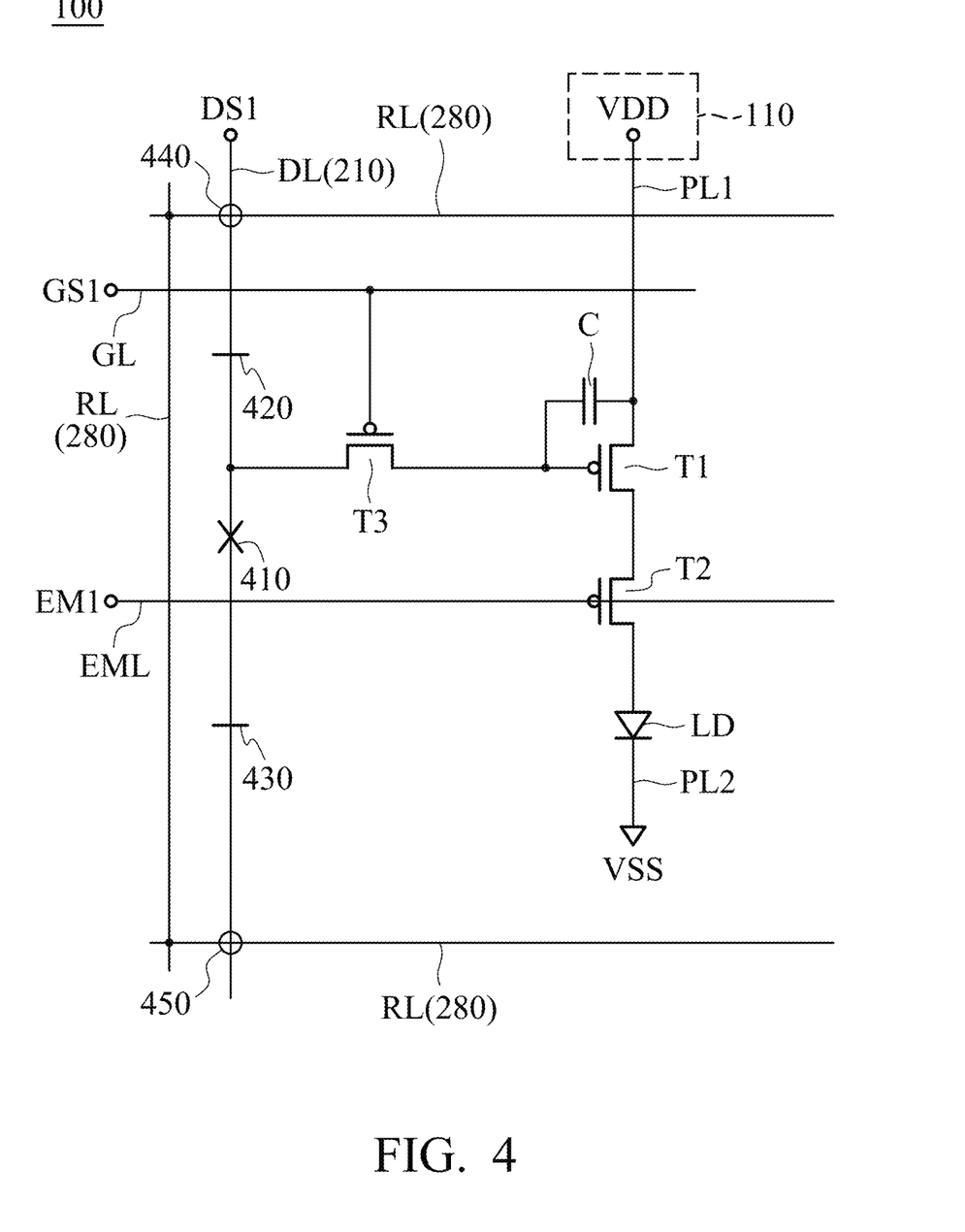
FIG. 4 is a schematic view of a repair operation of an electronic device according to an embodiment of the disclosure.

Please refer to FIG. 4. The signal line 210 may be the data line DL and electrically connected to the light-emitting unit LD. When a defect occurs in a position 410 of the data line DL, a cutting may be performed at a position 420 and a position 430 of two sides of the defect position 410 on the data line DL. The cause of the defect may, for example, be damage caused by a particle or an electrostatic discharge. The repairing structure 200 described in the disclosure may be adopted for use in at least one of the cutting position 420 and the cutting position 430.

Figure 2B:
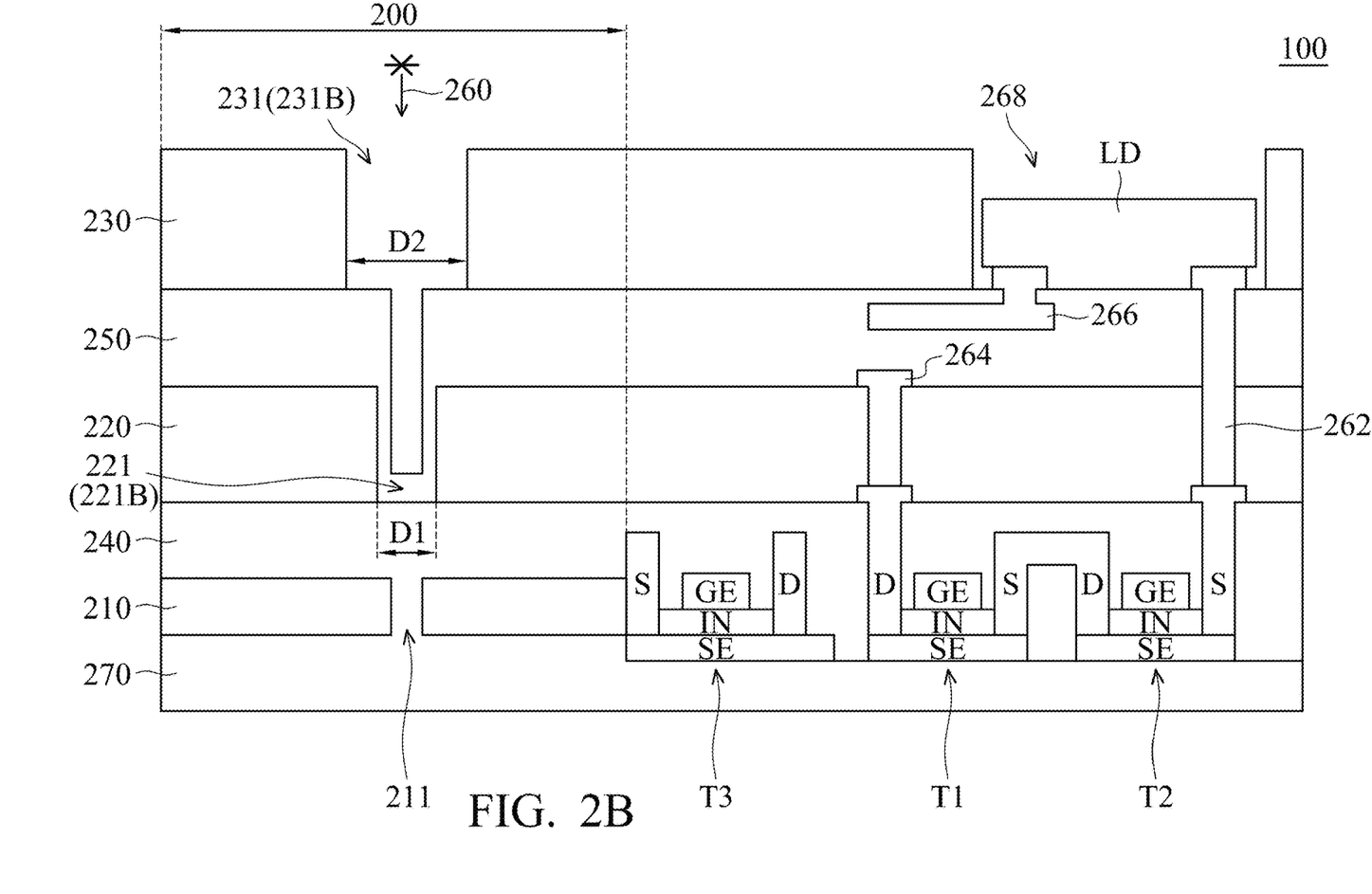
FIG. 2B is a section view of a laser cutting performed on the electronic device in FIG. 2A.

Please refer to FIG. 2B and FIG. 4 at the same time. The laser cutting may be performed on the signal line 210. Specifically, a manner of laser cutting may be used at least one of the cutting position 420 and the cutting position 430 on the signal line 210 (data line DL) to obtain the repairing structure 200 shown in FIG. 2B. According to other embodiments, the signal line 210 may be the gate line GL or the emission signal line EML, but the disclosure is not limited thereto. As shown in FIG. 2B, when the laser beam is used to perform the laser cutting, the part of the signal line 210 that overlaps the position of the laser light source 260 may be cut by the laser light source 260. Specifically, the laser beam generated by the laser light source 260 may pass through the second hole 231 of the second insulation layer 230 and the first hole 221 of the first insulation layer 220 to the signal line 210, so that the signal line 210 is melted and cut by the laser light source 260, and a cutting portion 211 is formed inside the signal line 210, achieving the effect of signal isolation.

Figure 2C:
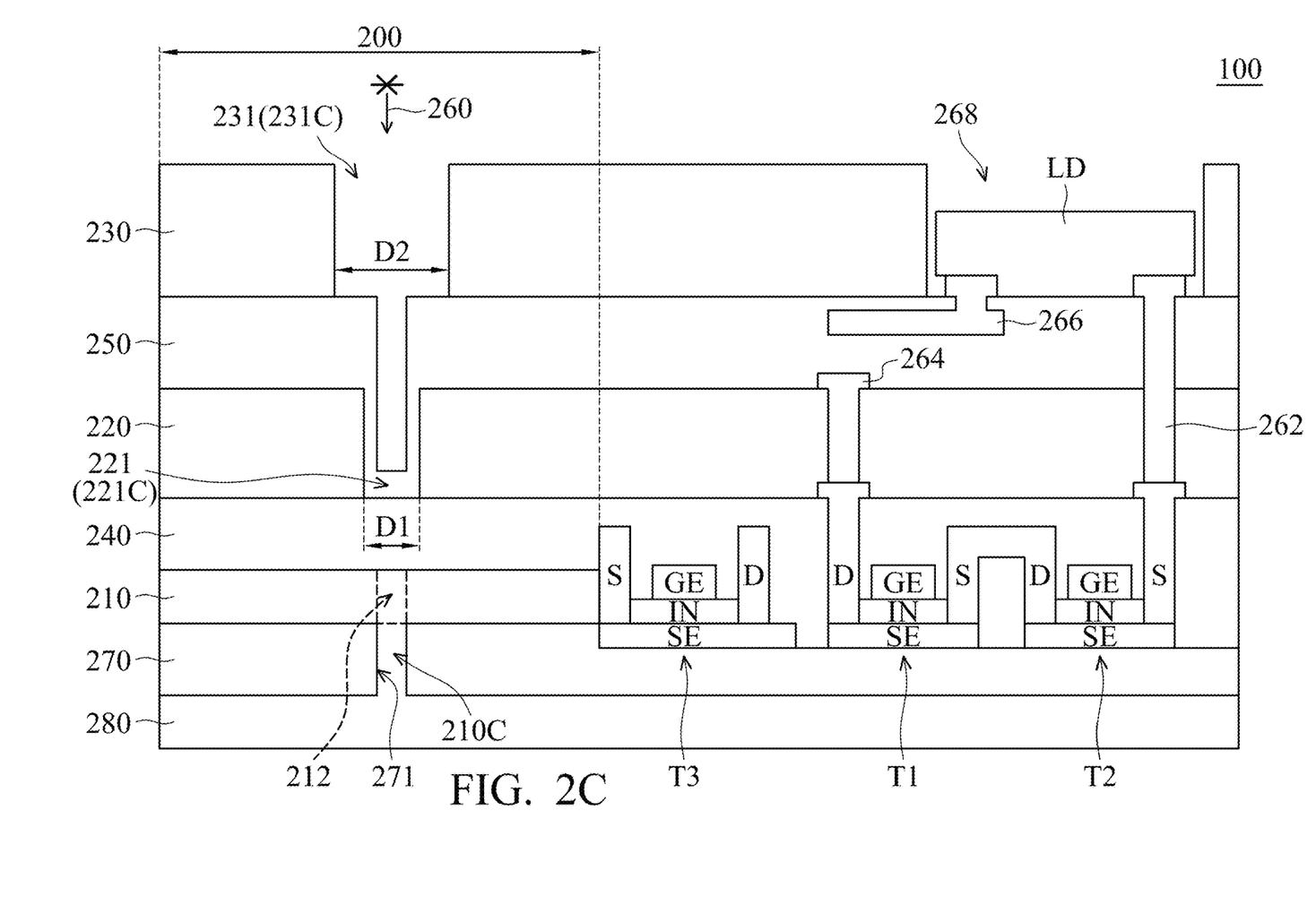
FIG. 2C is a section view of a laser welding performed on the electronic device in FIG. 2A.

Please refer to FIG. 2C and FIG. 4 at the same time. The laser welding may be performed on the signal line 210. Specifically, a manner of laser welding may be used at least one of the welding position 440 and the welding position 450 on the signal line 210 (data line DL) to obtain the repairing structure 200 shown in FIG. 2C. As shown in FIG. 2C, when the laser beam is used to perform the laser welding, the part 212 of the signal line 210 that overlaps the position of the laser light source 260 may be melted by the laser light source 260. Specifically, the laser beam generated by the laser light source 260 may pass through the second hole 231 of the second insulation layer 230 and the first hole 221 of the first insulation layer 220, so that the part of the fifth insulating layer 270 that overlaps the position of the laser light source 260 is cut by the laser light source 260 and a gap 271 is formed inside the fifth insulating layer 270, and the part of the signal line 210 is melted and drops along the sidewall formed by the gap 271 of the fifth insulating layer 270 and onto the repairing line 280. Accordingly, the melted signal line 210 may be formed inside the gap 271 to serve as a connection portion 210C, so that the signal line 210 may be connected to the repairing line 280 through the connection portion 210C to generate an electrical connection. Then, the signal transmitted by the signal line 210 may be transmitted by the repairing line 280, thereby repairing the signal. Therefore, the design of the repairing structure 200 is simple, or the repairing time may be decreased, increasing the convenience of use. In some embodiments, the connection portion 210C may at least partially overlap at least one of the first hole 221 and the second hole 231, but the disclosure is not limited thereto.

According to some embodiments, please refer to FIG. 4, the signal 210 (data line DL) may include the laser cutting position 420 and the laser welding position 440 at the same time. Specifically, in the electronic device 100, the first insulation layer 220 may include a first hole 221C (as shown in FIG. 2C) and another first hole 221B (as shown in FIG. 2B), and the second insulation layer 230 may include a second hole 231C (as shown in FIG. 2C) and another second hole 231B (as shown in FIG. 2B). The other first hole 221B and the other second hole 231C at least partially overlap. As shown in FIG. 2C, the laser welding may be performed in a position that overlaps at least one of the first hole 221C and the second hole 231C, so that the signal line 210 may be electrically connected to the repairing line 280 through the connection portion 210C. As shown in FIG. 2B, the laser cutting may be performed in a position that overlaps at least one of the other first hole 221B and the other second hole 231B, so as to form the cutting portion 211 of the signal line 210. The cutting portion 211 at least partially overlaps at least one of the other first hole 221B and the other second hole 231B.

In some embodiments, the width D1 of the first hole 221 of the first insulation layer 220 or the width D2 of the second hole 231 of the second insulation layer 230 may be greater than the width of the size of the laser beam from the laser light source. Accordingly, the laser cutting or the laser welding may be performed easily. For example, when the laser beam emitted by the laser light source 260 is used to perform the laser cutting on the signal line 210, the design of the width of the above holes may allow space for metal splashing. In addition, the size of the laser beam from the laser light source 260 may be 3 micrometers*3 micrometers, but the disclosure is not limited thereto. For example, the width D1 of the first hole 221 of the first insulation layer 220 or the width D2 of the second hole 231 of the second insulation layer 230 may be greater than 3 micrometers, but the disclosure is not limited thereto.

Furthermore, the third insulation layer 240 is disposed between the signal line 210 and the first insulation layer 220, and a part of the insulation layer 240 may be exposed in the first hole 221 of the first insulation layer 220. The fourth insulation layer 250 is disposed between the first insulation layer 220 and the second insulation layer 230, a part of the fourth insulation layer 250 may be located inside the first hole 221 of the first insulation layer 220, and the part of the fourth insulation layer 250 may also located on the third insulation layer 240.

Please refer to FIG. 1 and FIG. 2A. In the embodiment, the switch T1, the switch T2 and the switch T3 may respectively include a gate GE, a source S. a drain D, a semiconductor SE and an insulation layer IN. The insulation layer IN may be disposed between the semiconductor SE and the gate GE. Specifically, the gate GE of the switch T3 corresponds to the gate of the switch T3 of FIG. 1, the source S of the switch T3 corresponds to the source of the switch T3 of FIG. 1, and the drain D of the switch T3 corresponds to the drain of the switch T3 of FIG. 1. The gate GE of the switch T1 corresponds to the gate of the switch T1 of FIG. 1, the source S of the switch T1 corresponds to the source of the switch T1 of FIG. 1, and the drain D of the switch T1 corresponds to the drain of the switch T1 of FIG. 1. The gate GE of the switch T2 corresponds to the gate of the switch T2 of FIG. 1, the source S of the switch T2 corresponds to the source of the switch T2 of FIG. 1, and the drain D of the switch T2 corresponds to the drain of the switch T2 of FIG. 1.

FIG. 2A takes the switch T1, the switch T2 and the switch T3 as top gate transistors as an example, but the disclosure is not limited thereto. According to some embodiments, the switch T1, the switch T2 and the switch T3 may also be the top gate transistors, bottom gate transistors, or a combination thereof.

According to some embodiments, as shown in FIG. 1 and FIG. 2A, the signal line 210 may be the data line D1, and the signal line 210 is coupled to the source S of the switch T3. The electronic device 100 further includes a conductive structure 262, a conductive structure 264 and a conductive structure 266. The conductive structure 262 may be a wiring that is coupled to the first terminal (such as the anode terminal) of the light-emitting unit LD and the switch T2. The conductive structure 264 may be a wiring that is coupled to the power source 110 and the switch T3, such as the first power source line PL1. The conductive structure 266 may be a wiring that is coupled to the second terminal (such as the cathode) of the light-emitting unit LD and the reference voltage VSS (such as the ground voltage), such as the second power source line PL2. The second insulation layer 230 may include a well structure 268, and the well structure 268 is used to accommodate the light-emitting unit LD of the electronic device 100. In addition, in the embodiment, the width of the well structure 268 may be greater than the width D1 of the first hole 221 or the width D2 of the second hole 231, but the disclosure is not limited thereto.

Figure 3A:
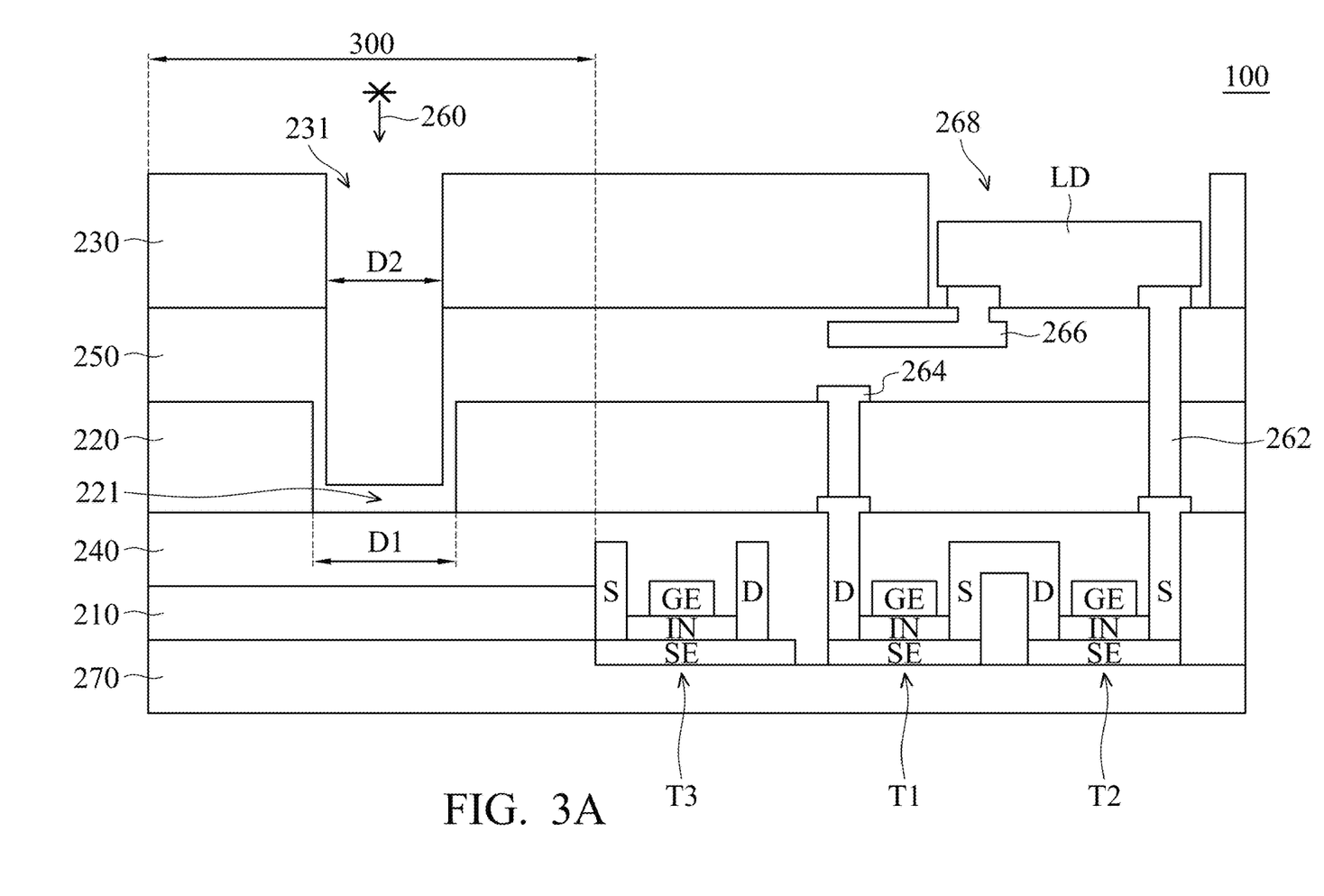
FIG. 3A is a section view of an electronic device according to another embodiment of the disclosure.

FIG. 3A is a section view of an electronic device 100 according to another embodiment of the disclosure, which shows position relationships of the repairing structure 300, the switch T1, the switch T2, the switch T3 and the light-emitting unit LD. Please refer to FIG. 3A. The electronic device 100 includes the switch T1, the switch T2, the switch T3, the conductive structure 262, the conductive structure 264, the conductive structure 266, the light-emitting unit LD and the repairing structure 300. In the embodiment, the switch T1, the switch T2, the switch T3, the conductive structure 262, the conductive structure 264, the conductive structure 266 and the light-emitting unit LD in FIG. 3A are equal to or similar to the embodiment of FIG. 2A. Accordingly, the above components may refer to the description of the embodiment of FIG. 2A, and the description thereof is not repeated herein.

In the embodiment, the repairing structure 300 may be pre-disposed in a position that the electronic device 100 needs to be repaired so that when the electronic device 100 occurs a defect, the circuit of the electronic device 100 may be repaired through the repairing structure 300. The repairing structure 300 may include a signal line 210, a first insulation layer 220, a second insulation layer 230, a third insulation layer 240, a fourth insulation layer 250, a fifth insulation layer 270 and a repairing line 280. A disposing relationship of the signal line 210, the first insulation layer 220, the second insulation layer 230, the third insulation layer 240, the fourth insulation layer 250, the fifth insulation layer 270 and the repairing line 280 of the repairing structure 300 of FIG. 3A is equal to or similar to the disposing relationship of the signal line 210, the first insulation layer 220, the second insulation layer 230, the third insulation layer 240, the fourth insulation layer 250, the fifth insulation layer 270 and the repairing line 280 of the repairing structure 200 of FIG. 2A. The above components may refer to the description of the embodiment of FIG. 2A, and the description thereof is not limited thereto.

In the embodiment, the width D2 of the second hole 231 is, for example, less than the width D1 of the first hole 221. Therefore, the repairing structure 300 may further reduce the chance of the particle remaining in the second hole 231, so as to reduce the problem of the signal line 210 being crushed or being damaged by the electrostatic discharge (ESD). In some embodiments, the above particle is, for example, generated by the manufacturing process, the manufacturing environment, or the manufacturing equipment, but the disclosure is not limited thereto.

In the embodiment, the user may operate a laser light source 260 to generate a laser beam, and the laser beam from the laser light source 260 may pass through the second hole 231 of the second insulation layer 230 and the first hole 221 of the first insulation layer 220 to the signal line 210, so as to perform the laser cutting or the laser welding on the signal line 210.

Figure 3B:
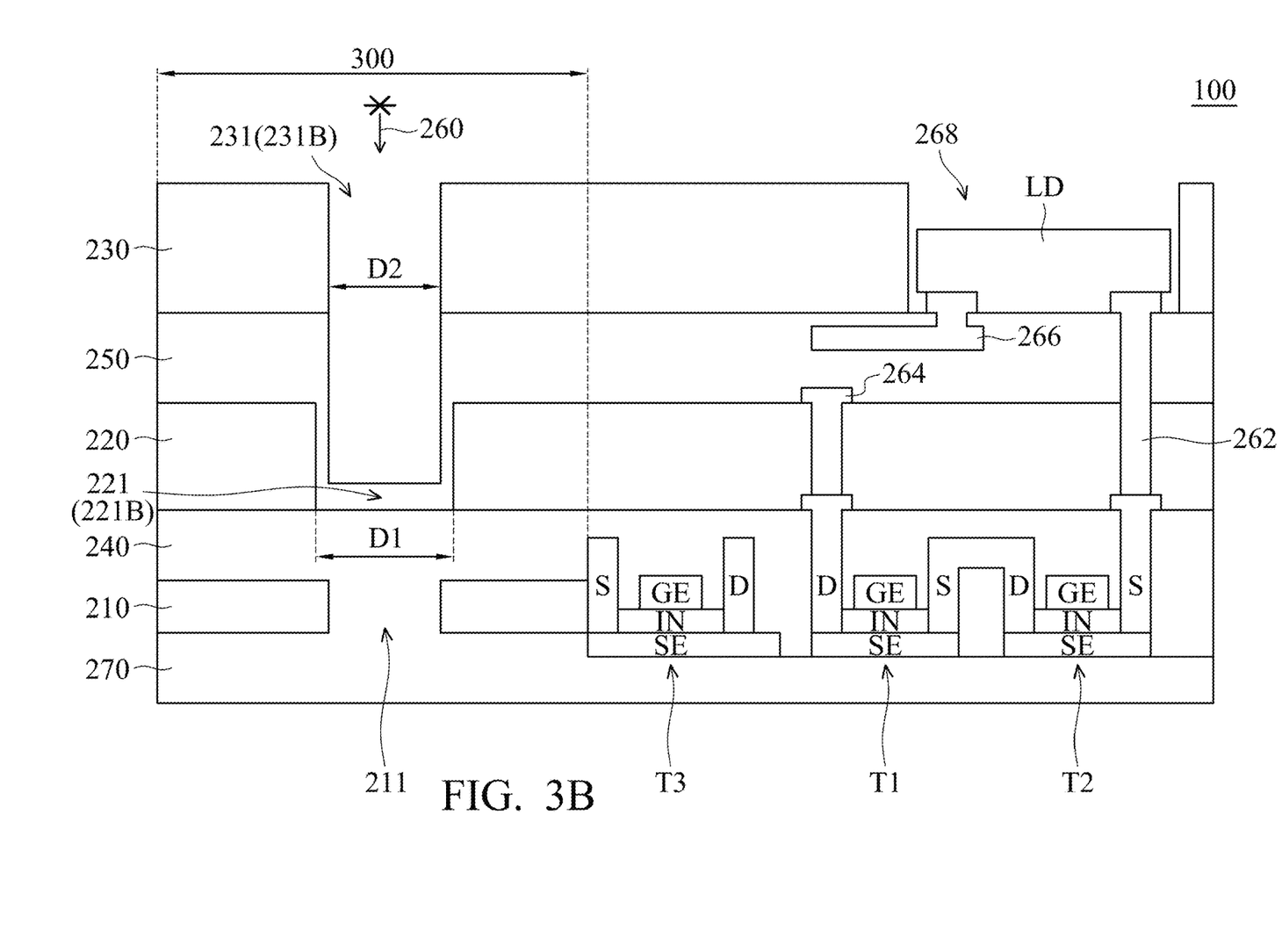
FIG. 3B is a section view of a laser cutting performed on the electronic device in FIG. 3A.

As shown in FIG. 3B, when the laser beam is used to perform the laser cutting, the part 211 of the signal line 210 that overlaps the position of the laser light source 260 may be cut by the laser light source 260. Specifically, the laser beam generated by the laser light source 260 may pass through the second hole 231 of the second insulation layer 230 and the first hole 221 of the first insulation layer 220 to the signal line 210, so that the signal line 210 is melted and cut by the laser light source 260, and a cutting portion 211 is formed inside the signal line 210, achieving the effect of signal isolation. Similar to the above, in FIG. 4, at least one of the cutting position 420 and the cutting position 430 of the data line DL may include the repairing structure 300 shown in FIG. 3B, and the description thereof is not repeated herein.

Figure 3C:
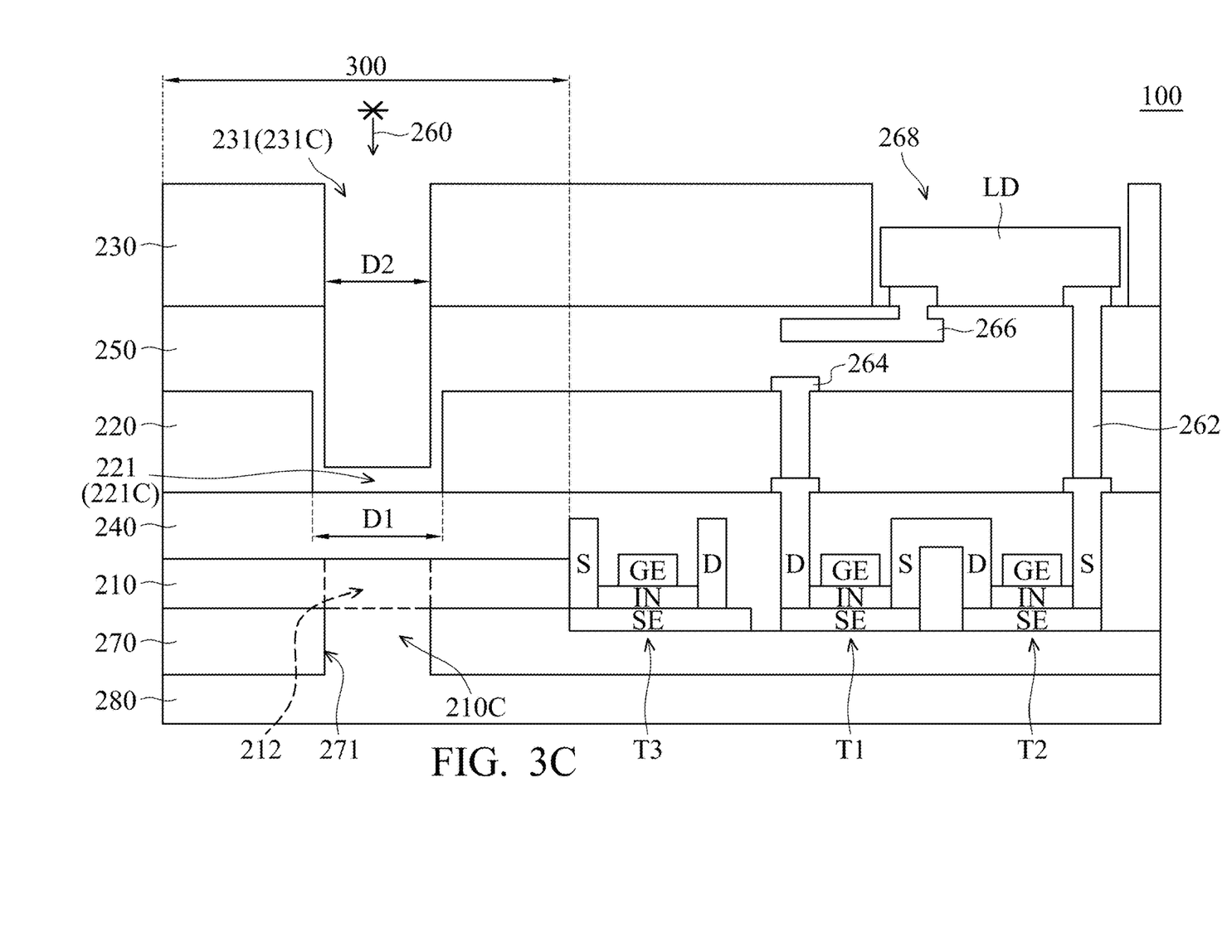
FIG. 3C is a section view of a laser welding performed on the electronic device in FIG. 3A.

As shown in FIG. 3C, when the laser beam is used to perform the laser welding, the part 212 of the signal line 210 that overlaps the position of the laser light source 260 may be melted by the laser light source 260. Specifically, the laser beam generated by the laser light source 260 may pass through the second hole 231 of the second insulation layer 230 and the first hole 221 of the first insulation layer 220, so that the part of the fifth insulating layer 270 that overlaps the position of the laser light source 260 is cut by the laser light source 260 and a gap 271 is formed inside the fifth insulating layer 270, and part of the signal line 210 is melted and drops along the sidewall formed by the gap 271 of the fifth insulating layer 270 and onto the repairing line 280. Accordingly, the melted signal line 210 may be formed inside the gap 271 to serve as a connection portion 210C, so that the signal line 210 may be connected to the repairing line 280 through the connection portion 210C to generate an electrical connection. Then, the signal line 210 may be bonded to the repairing line 280 to generate an electrical connection.

Afterward, the signal transmitted by the signal line 210 may be transmitted by the repairing line 280, repairing the signal. Therefore, the design of the repairing structure 300 is simple, or the repairing time may be decreased, increasing the convenience of use. Similar to the above, in FIG. 4, at least one of the welding position 440 and the welding position 450 may include the repairing structure 300 shown in FIG. 3C, and the description thereof is not repeated herein.

The above repairing structure 200 (or the repairing structure 300) disposed on the position 420, the position 430, the position 440 and the position 450 of the data line DL of the electronic device 100 is an exemplary embodiment of the disclosure, but the disclosure is not limited thereto. The repairing structure 200 (or the repairing structure 300) may also disposed on other positions of the data line DL of the electronic device 100, and the same effect of repairing may be achieved.

Figure 5:
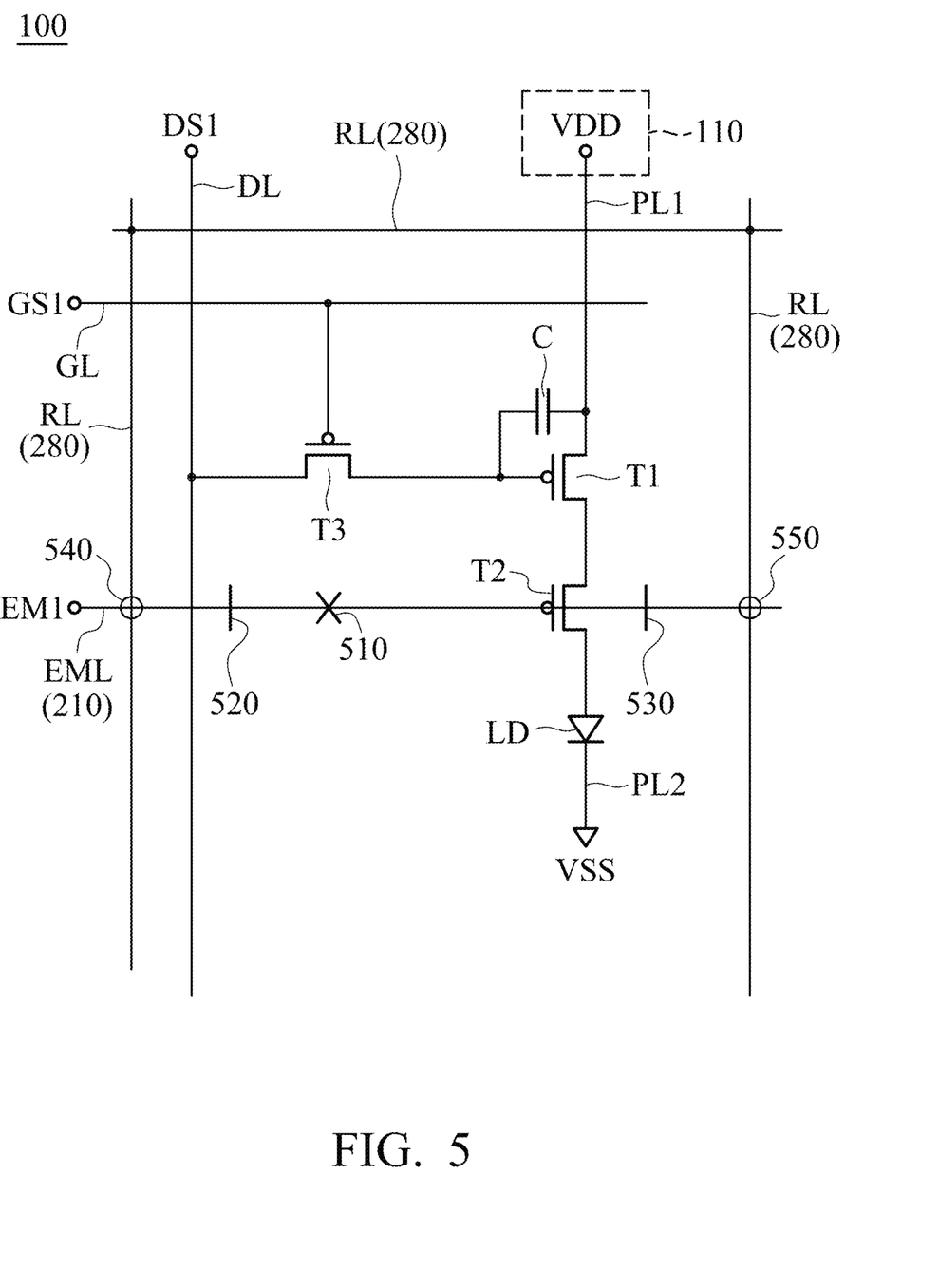
FIG. 5 is a schematic view of a repair operation of an electronic device according to an embodiment of the disclosure.

FIG. 5 is a schematic view of a repair operation of an electronic device according to an embodiment of the disclosure. Please refer to FIG. 5. The signal line 210 of the repairing structure 200 (or the repairing structure 300) may be the emission signal line EML of the electronic device 100, and the repairing structure 200 (or the repairing structure 300) may also disposed on a position 520, a position 530, a position 540 and a position 550 of the emission signal line EML of the electronic device 100. The emission signal line EML may be electrically connected to the light-emitting unit LD. When a defect occurs in a position 510 of the emission signal line EML, a cutting may be performed at the position 520 and the position 530 of two sides of the defect position 510 on the emission signal line EML. At least one of the cutting position 520 and the cutting position 530 may adopt the repairing structure of the disclosure. Specifically, at least one of the cutting position 520 and the cutting position 530 may include the repairing structure 200 shown in FIG. 2B or the repairing structure 300 shown in FIG. 3B.

In addition, the laser beam from the laser light source 260 is used to perform the laser welding at the position 540 and the position 550 of the electronic device 100, so that the emission signal line EML may be electrically connected to the repairing line RL (280). For example, a manner of laser welding may be used for at least one of the welding position 540 and the welding position 550 on the emission signal line EML to generate the repairing structure 200 shown in FIG. 2C and the repairing structure 300 shown in FIG. 3C. Specifically, at least one of the welding position 540 and the welding position 550 may include the repairing structure 200 shown in FIG. 2C or the repairing structure 300 shown in FIG. 3C. Therefore, the signal line 210 (such as the emission signal line EML) and the repairing line 280 such as the repairing line (such as the repairing line RL) may be bonded, so that the signal transmitted by the emission signal line EML can be transmitted through the repairing line RL, so as to achieve the repairing effect.

The repairing structure 200 (or the repairing structure 300) disposed at the position 520, the position 530, the position 540 and the position 550 of the emission signal line EML of the electronic device 100 is an exemplary embodiment of the disclosure, but the disclosure is not limited thereto. The repairing structure 200 (or the repairing structure 300) may also be disposed at other positions of the emission signal line EML of the electronic device 100, and the same repairing effect may also be achieved.

Furthermore, when the signal line 210 of the repairing structure 200 (or the repairing structure 300) may be the scan line GL, the first power source line PL1 or the second power source line PL2 of the electronic device 100, the manner of the signal line 210 of the repairing structure 200 (or the repairing structure 300) disposed on the scan line GL, the first power source line PL1 or the second power source line PL2 of the electronic device 100 may refer to the embodiment of FIG. 4 or FIG. 5, and the description thereof is not repeated herein.

In summary, according to the repairing structure and the electronic device the embodiments of the disclosure, the first insulation layer is disposed on the signal line, the second insulation layer is disposed on the first insulation layer, the first hole of the first insulation layer overlaps a part of the signal line, and the first hole and the second hole at least partially overlap. The laser cutting and the laser welding may be performed on the signal line through the first hole and the second hole. Therefore, the design of the repairing structure is simple, or the repairing time may be decreased, so as to increase the convenience of use.

While the disclosure has been described by way of example and in terms of the preferred embodiments, it should be understood that the disclosure is not limited to the disclosed embodiments. On the contrary, it is intended to cover various modifications, combinations, and similar arrangements (as would be apparent to those skilled in the art).

Therefore, the scope of the appended claims should be accorded the broadest interpretation to encompass all such modifications, combinations, and similar arrangements.

What is claimed is:

1. An electronic device, comprising:
    a conductive structure;
    a semiconductor electrically connected to the conductive structure;
    a first insulation layer; and
    a second insulation layer, wherein the first insulation layer is disposed between the conductive structure and the second insulation layer;
    wherein the first insulation layer comprises a first hole, the first hole overlaps a part of the conductive structure, the second insulation layer comprises a second hole, and the first hole and the second hole at least partially overlap;
    wherein along a direction, a width of the second hole is less than a width of the first hole.

2. The electronic device according to claim 1, wherein the first insulation layer comprises an organic layer, an inorganic layer, or a combination thereof.

3. The electronic device according to claim 1, wherein the second insulation layer comprises an organic layer, an inorganic layer, or a combination thereof.

4. The electronic device according to claim 1, wherein the first insulation layer comprises an organic layer, and the second insulation layer comprises an inorganic layer.

5. The electronic device according to claim 1, wherein the electronic device is a display device.

6. The electronic device according to claim 5, wherein the electronic device is a liquid crystal display device.

7. The electronic device according to claim 1, wherein the electronic device is a control system device.

8. The electronic device according to claim 1, wherein the electronic device is a semiconductor device.

9. The electronic device according to claim 1, wherein the electronic device is a circuit device.

10. The electronic device according to claim 1, wherein the conductive structure is a signal structure.

* * * * *